United States Patent [19]

Cole et al.

[11] Patent Number: 5,095,286
[45] Date of Patent: Mar. 10, 1992

[54] FIBER OPTIC RECEIVER AND AMPLIFIER

[75] Inventors: James H. Cole, Great Falls, Va.; Ira J. Bush, Los Angeles, Calif.; Leonard Baker, Bethesda, Md.

[73] Assignee: Dylor Corporation, Chantilly, Va.

[21] Appl. No.: 436,609

[22] Filed: Nov. 15, 1989

[51] Int. Cl.$^5$ .............................................. H03F 3/08
[52] U.S. Cl. ................................. 330/308; 250/214 A
[58] Field of Search ............. 330/59, 308; 250/214 A; 455/619

[56] References Cited

U.S. PATENT DOCUMENTS

| | | | |
|---|---|---|---|
| 4,139,767 | 2/1979 | Witkowicz | 250/214 A |
| 4,761,549 | 8/1988 | Mealer, III et al. | 330/308 X |
| 4,764,732 | 8/1988 | Dion | 330/59 |

OTHER PUBLICATIONS

Anson et al., "Versatile Precision Source Ratioing System for Fast Kinetic Spectroscopy", *Review of Scientific Instruments*, vol. 47, No. 3, pp. 370-373, Mar. 1976.
Hullett et al., A Feedback Receive Amplifier for Optical Transmission Systems, IEEE Transactions on Communications, Oct. 1976.
Catalog description PD050-PM, RSL-50, High Speed Fiber-Pigtailed GaAs, Ortel Corp., (4 pp.).
Catalog description PD050-OM, Photodiode, Ortel Corp., (4 pp.).

*Primary Examiner*—James B. Mullins
*Attorney, Agent, or Firm*—Reed Smith Shaw & McClay

[57] ABSTRACT

An electronic receiver circuit for receiving and amplifying optical signals is disclosed. The optical signal is applied to a photodiode which generates a current signal that passes through a source load with a high resistance or impedance relative to the impedances associated with the desired bandwidth of the optical signal. The current signal is amplified and buffered by an amplifier circuit which can drive low output impedances while maintaining the proper voltage level on the high impedance source load. The receiver circuit also maintains a wide signal bandwidth from RF to microwave frequencies, holds pre-amplifier distortion to very low levels and still yields a high signal-to-noise ratio.

2 Claims, 2 Drawing Sheets

FIBER OPTIC RECEIVER AND AMPLIFIER

FIELD OF THE INVENTION

The present invention relates to an electronic circuit for receiving analog or digital information in the radio frequency (RF) or microwave spectrum which is inscribed on an optical beam and converting that optical signal to an electrical signal.

BACKGROUND OF THE INVENTION

Coherent light is a common communications medium for the high speed transmission of large amounts of information. An optical receiver in such a communication system must be able to separate at high frequency over a large dynamic range (i.e., have a wide bandwidth) with a great linearity (i.e., have a low distortion). Such a receiver consists of two main parts' a photodetector and an amplifier. The typical photodetector used in these applications is a diode which is sensitive to light at a particular wavelength. This photodiode can be accurately modeled as an ideal current source in shunt with a capacitor, the capacitance of which is characteristic of the diode.

There are two common ways to amplify the signal from the photodiode. In FIG. 1A, photodiode 2 is coupled in series with load resistor 4 which matches the resistance of conventional amplifiers. Load resistor 4 has value of about 75 ohms for video systems and 50 ohms for microwave systems. Photodiode 2 is reverse biased by voltage source 5 which causes photodiode 2 to produce a current $I_{I/A}$ corresponding to the incident light signal 1. The current $I_{I/A}$ passes through load resistor 4 and the voltage signal generated across load resistor 4 is amplified using a conventional amplifier 3. Unfortunately, with most photodiodes, because their capacitance is small, the combination of the photodiode 2 with the load resistor 4 is unable to provide the desired carrier signal-to-noise ratio (~50db in a 1 GHz altogether bandwidth).

In FIG. 1B, a second receiver type called a transimpedance or transresistance amplifier is shown. Photodiode 7 is coupled to an amplifier input which has a very low impedance, practically a virtual ground. Photodiode 7 is reverse biased by voltage source 10 to generate a current $I_{I/B}$ analogous to the information from light signal 6. The current is input to amplifier 8 and a feedback resistor 9 is used to maintain stability. This configuration minimizes the effects of the capacitance of the photodiode and provides an amplifier with a wide bandwidth and a high gain. However, harmonic distortion severely limits receiver performance for many dynamic range applications such as the fiber optic transmission of cable television signals. See J. Hullett et al. "A Feedback Receiver Amplifier For Optical Transmission Systems,"IEEE Transactions On Communications, Oct. 1976 at pp. 1180–1185 for more information on receiver models.

SUMMARY OF THE INVENTION

The present invention is an electronic receiver amplifier circuit in which an optical signal is received by one or more photodiodes coupled to large source loads. The signals generated by the photodiodes across the large source loads are amplified by an amplifier. The amplifier also acts as an impedance buffer to drive the low impedances associated with RF or microwave amplifiers while maintaining the necessary voltage level across the large source loads. The effective power gain of the amplifier is proportional to the ratio of the input impedance over the output impedance seen by the amplifier. Signals which are out of phase with each other and are generated with one or more photodiodes are amplified and combined differentially to provide significant reduction in harmonic distortion.

The amplifier boosts the lower power signal from the high impedance source load to an elevated power signal input into a low resistance output load. This is accomplished while maintaining a wide bandwidth from RF to microwave frequencies. The circuit also holds preamplifier distortion to very low levels relative to the amplifier output signal while yielding a high signal-to-noise ratio.

The receiver and amplifier circuit of the present invention is able to receive high frequency information over a large dynamic range while still maintaining high linearity. Possible applications for this invention include receiving and converting optical information from optical fiber transmission systems including signals from radar or television antennas, or signals generated for the optical distribution of cable televisions. For example, with 40 television channels, all distortion products are greater than 65db down. Another application is converting optical signals from optically based sensors such as fiber optic sensors to an analog electrical signal.

Other details, objects and advantages of the present invention will become more readily apparent from the following description of a presently preferred embodiment thereof.

BRIEF DESCRIPTION OF THE DRAWINGS

In the accompanying drawings, preferred embodiments of the present invention are illustrated, by way of example only, wherein.

DESCRIPTION OF THE PREFERRED EMBODIMENT

Figure 1A:
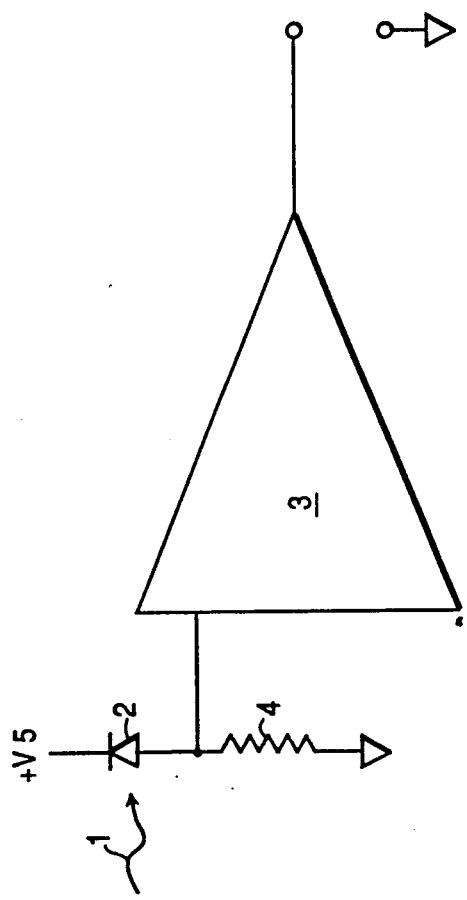
FIG. 1A is a schematic of a prior art receiver circuit consisting of a photodiode coupled to a low input impedance amplifier.
Figure 1B:
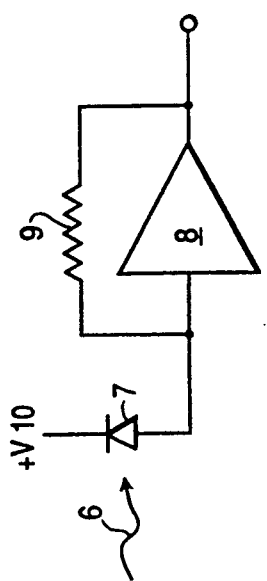
FIG. 1B is a schematic of a prior art receiver circuit consisting of a photodiode connected to a transimpedance amplifier.
Figure 2:
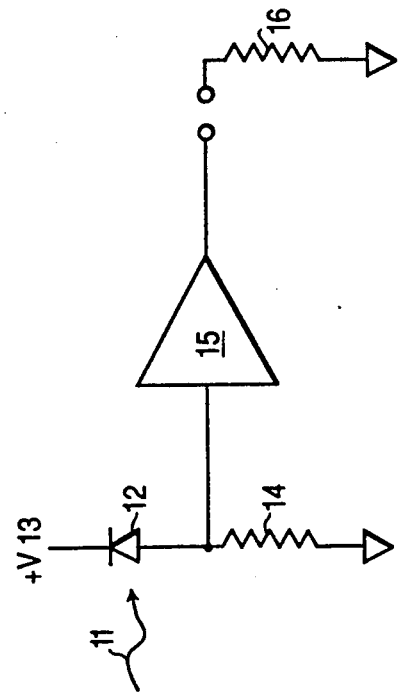
FIG. 2 is a schematic of a receiver and amplifier of the present invention.

As shown in FIG. 2, information inscribed on an optical beam 11 is detected by photodiode 12 which is reverse biased by voltage source 13. The current signal I generated by the photodiode, which is an analog of the information inscribed on the optical signal, passes through source load resistor 14 which was a value much higher than found in prior art applications (e.g., 500 ohms versus 50 or 75 ohms). The voltage generated by the current across the load resistor is amplified by amplifier 15 which may be configured differentially or single-ended. It is also possible to add features to the output of amplifier 15 such as automatic gain control, automatic level control, or self diagnostic if desired.

Figure 3:
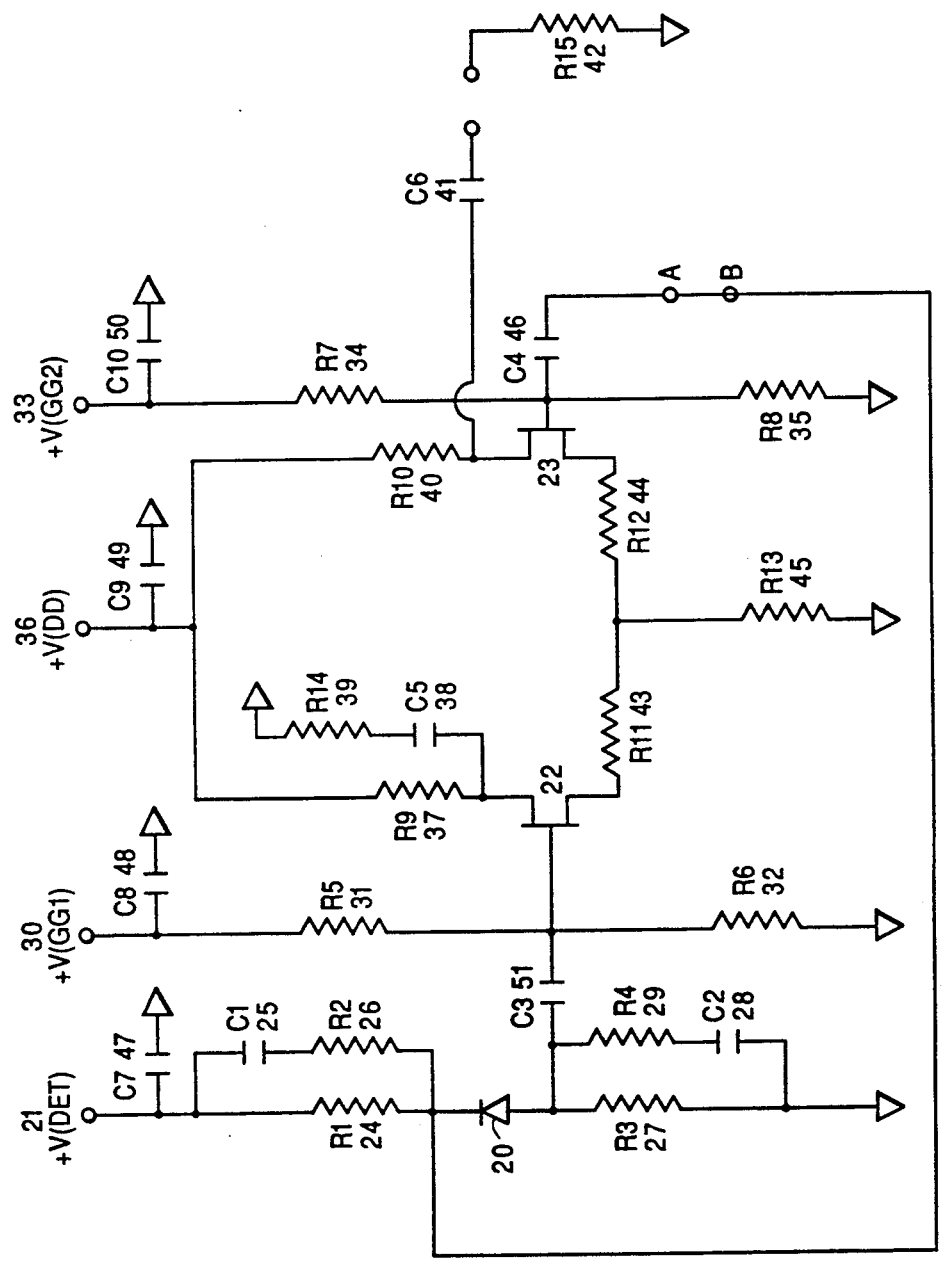
FIG. 3 is a detailed circuit diagram illustrating a preferred embodiment of the present invention.

FIG. 3 is a detailed circuit diagram of a preferred embodiment of an optical receiver and amplifier of the present invention utilizing a differential long-tailed amplifier using Field Effect Transistors (FETs) such as ATF-10135. The amplifier is not limited to the use of only FETs; other devices such as bipolar transistors can be used where appropriate.

In this circuit, photodiode 20 is reverse biased by voltage source 21. This means photodiode 20 approximates a pure current source at all frequencies of interest (RF to microwave) which permits balanced source loads and impedances. Source loads 24, 25, 26 and 27, 28, 29 are used to configure an appropriate high impedance in put in order to maintain the proper input signal-to-noise ratio. Nevertheless, the full differential signal appears across the input terminals of transistors 22 and 23. These source loads also allow for separate AC and DC paths to ground, providing greater flexibility in the amplifier design.

Transistors 22 and 23 are in a push-pull configuration which, along with photodiode 20 and source loads 24, 25, 26 and 27, 29, 29 yields maximum second-order distortion cancellation when the proper 180° phase relationship is maintained over the full bandwidth. It is necessary that both push-pull transistors 22 and 23 have their gains and even-order nonlinearities nearly equal for maximum even-order distortion cancellation. This is accomplished by adjusting bias voltage networks 30, 31, 32; 33, 34, 35; and 36. The DC and RF loads 37, 38, 39 and 40, 41, 42 also need to be balanced. Transistors 22 and 23 are matchselected for low noise, high linearity, and frequency operation in the gigahertz range.

Coupling capacitors 46 and 51 are placed between the photodiode and the gates of the FETs to separate the DC characteristics of the photodiode from the bias conditions of the transistors in order to improve performance over a larger range of optical power levels on the receiver. Capacitors 47, 48, 49 and 50 eliminate noise from the biasing voltage sources 21, 30, 36 and 33. All capacitors in FIG. 3 have small reactance compared to other impedances in their loops at the lowest frequency of interest.

Some typical values for the components used in FIG. 3 are:

| | |
|---|---|
| 24 = R1 = 750 Ω | 39 = R14 = 75 Ω |
| 25 = C1 = 1000 pF | 40 = R10 = 150 Ω |
| 26 = R2 = 240 Ω | 41 = C6 = 1000 pF |
| 27 = R3 = 750 Ω | 42 = R15 = 75 Ω |
| 28 = C2 = 1000 pF | 45 = R13 = 270 Ω |
| 29 = R4 = 240 Ω | 46 = C4 = 1000 pF |
| 31 = R5 = 22K Ω | 47 = C7 = 4700 pF |
| 32 = R6 = 3.3K Ω | 48 = C8 = 4700 pF |
| 34 = R7 = 22K | 49 = C9 = 4700 pF |
| 35 = R8 = 3.3K Ω | 50 = C10 = 4700 pF |
| 37 = R9 = 150 Ω | 51 = C3 = 1000 pF |
| 38 = C5 = 1000 pF | |

There are several alternative embodiments for this circuit including but not limited to the following. First, single-ended input operation may be accomplished by: replacing source loads 24, 25 and 26 with a short; opening jumper AB; and grounding point A. Single-ended input drive does not eliminate differential operation since large resistor 45 forces the differential RF currents of transistors 22 and 23 into a 180° phase relationship. Second, resistor 45 could be replaced by a current source FET configuration. Third, the amplifier can be configured as a differential output amplifier when resistor 39, in addition to 42, becomes the input impedance of the next device beyond the amplifier. Fourth, a second photodiode with appropriate source loading can be connected to point A instead of grounding point A, as in the single-ended case. This would be useful for some optical configurations such as fiber optic sensors employing Mach-Zender interferometers which have two optical outputs 180° out of phase.

While a presently preferred embodiment of practicing the invention has been shown and described with particularity in connection with the accompanying drawings, the invention may otherwise be embodied within the scope of the following claims.

What is claimed is:

1. An electronic receiver amplifier circuit comprising a photodiode connected in series between a first large source load and a second large source load, the source loads being balanced and each comprising a resistor in series with capacitor connected in parallel to a resistor, a differential amplifier comprising first and second transistors having a common source resistor, an impedance circuit connected to the collector of the first transistor and a second impedance circuit connected to the collector of the second transistor, said impedance circuits being balanced, said first and second transistors being biased to a proper value by a voltage divider, and said photodiode being capacitively coupled from each end thereof to the first and second transistors respectively.

2. The electronic receiver amplifier as described in claim 1 wherein the first and second transistors are field effect transistors.

* * * * *